United States Patent
Mase et al.

(10) Patent No.: US 11,618,127 B2
(45) Date of Patent: Apr. 4, 2023

(54) METHOD FOR SURFACE TREATMENT OF DLC COATED MEMBER

(71) Applicant: FUJI MANUFACTURING CO., LTD., Tokyo (JP)

(72) Inventors: Keiji Mase, Tokyo (JP); Shozo Ishibashi, Tokyo (JP); Yusuke Kondo, Tokyo (JP)

(73) Assignee: FUJI MANUFACTURING CO., LTD., Tokyo (JP)

( * ) Notice: Subject to any disclaimer, the term of this patent is extended or adjusted under 35 U.S.C. 154(b) by 757 days.

(21) Appl. No.: 16/560,102

(22) Filed: Sep. 4, 2019

(65) Prior Publication Data

US 2020/0282515 A1    Sep. 10, 2020

(30) Foreign Application Priority Data

Mar. 6, 2019 (JP) .............................. JP2019-040413

(51) Int. Cl.
*B24C 1/04*    (2006.01)
*C23C 14/58*    (2006.01)

(52) U.S. Cl.
CPC .............. *B24C 1/04* (2013.01); *C23C 14/588* (2013.01)

(58) Field of Classification Search
CPC ...... B24C 1/04; C23C 14/0605; C23C 14/588
See application file for complete search history.

(56) References Cited

U.S. PATENT DOCUMENTS

| 10,857,695 | B2* | 12/2020 | Mase | ................. B24C 11/00 |
| 2004/0147204 | A1* | 7/2004 | Sakai | ................. B24C 1/04 |
| | | | | 451/2 |
| 2018/0141102 | A1 | 5/2018 | Honda | |
| 2018/0222089 | A1 | 8/2018 | Mase et al. | |
| 2019/0030682 | A1 | 1/2019 | Mase et al. | |

(Continued)

FOREIGN PATENT DOCUMENTS

| CN | 107532279 A | 1/2018 |
| CN | 107848154 A | 3/2018 |

(Continued)

OTHER PUBLICATIONS

Corresponding Korean Application No. 10-2019-0115811, Korean Office action dated Dec. 11, 2020.

(Continued)

*Primary Examiner* — Christopher Remavege
(74) *Attorney, Agent, or Firm* — Ronald M. Kachmarik; Cooper Legal Group LLC

(57) ABSTRACT

A method for surface treatment of a DLC coated member that includes: taking as a treatment subject a DLC coated member having a DLC film coated on a base material surface; ejecting substantially spherical ejection particles having a median diameter of from 1 μm to 20 μm and a falling time through air of not less than 10 s/m against a surface of the film of the member at an ejection pressure of from 0.01 MPa to 0.7 MPa; and forming dimples on the surface of the film without exposing the base material so that a total projected area of the dimples is 50% or more of a treated region and so that the surface of the DLC film is processed to an arithmetic mean height (Sa) of from 0.01 μm to 0.1 μm and a texture aspect ratio (Str) of 0.4 or more.

4 Claims, 4 Drawing Sheets

Example 1

(56) References Cited

U.S. PATENT DOCUMENTS

2019/0076907 A1* 3/2019 Mase ................. B23B 51/06
2019/0076987 A1   3/2019 Mase et al.

FOREIGN PATENT DOCUMENTS

| CN | 109154057 A | 1/2019 | | |
|---|---|---|---|---|
| CN | 109304675 A | 2/2019 | | |
| JP | 2004-339564 A | 12/2004 | | |
| JP | 2005-193390 A | 7/2005 | | |
| JP | 2006-038000 A | 2/2006 | | |
| JP | 2006038000 A | 2/2006 | | |
| JP | 2010-126419 A | 6/2010 | | |
| JP | 2010126419 A | 6/2010 | | |
| JP | 2017-206761 A | 11/2017 | | |
| JP | 2018155728 A | 10/2018 | | |
| KR | 10-2019-0013440 A | 2/2019 | | |
| WO | 2017/169303 A1 | 10/2017 | | |
| WO | WO-2017169303 A1 * | 10/2017 | ............. | B21D 37/01 |

OTHER PUBLICATIONS

Corresponding Chinese Application No. 201911173565.9, Chinese Office action dated Feb. 3, 2021.

Kumagaya Masao, "WPC processing and its composite technology," Foreign Locomotive & Rolling Stock Technology, Jul. 2018, Issue 4.

Kumagaya Masao, "Surface modification technology using microparticle spray and its application" Foreign Locomotive & Rolling Stock Technology, Jul. 2016, Issue 4.

* cited by examiner

Comparative Example 1

Example 1

METHOD FOR SURFACE TREATMENT OF DLC COATED MEMBER

BACKGROUND OF THE INVENTION

1. Field of the Invention

The present invention relates to method for surface treatment of a member/s coated with diamond-like carbon (DLC) film/s, and more specifically relates to method for surface treatment of a DLC coated member/s to form multiple fine dimples so as to exhibit advantageous effects such as a reduction in sliding resistance on the surface/s of the DLC film/s on the DLC coated member/s.

2. Description of the Prior Art

DLC that is non-crystalline (amorphous) hard carbon is high in hardness, and as well as having excellent wear resistance, also has properties such as a low friction coefficient and impeding other materials from adhering thereto. Thus coating cutting-edges of cutting tools, sliding surfaces of sliding members, and internal faces of the cavities of molds with a DLC film is a method utilized in surface modification with the objective of improving wear resistance and slidability, improving demoldability, and the like.

Thus DLC coated members coated with a DLC film already have the advantageous effects of a low friction coefficient and excellent wear resistance, as well as having excellent demoldability and the like. There is, however, also a proposal to form multiple fine dimples with function as oil reservoirs and the like on a surface of a DLC film, with the objective of achieving further improvements in lowering the friction coefficient and raising wear resistance of such DLC coated members and further improvements in demoldability and the like.

There is a proposal for a method for forming such dimples in which, for example, indentations that will become such dimples are formed on the surface of a base material prior to forming a DLC film. Then by forming the DLC film on the surface of the base material, the dimples formed on the base material are also caused to appear on the surface of the DLC film.

However this method results in an uneven quality of a film, such as a film thickness of DLC film that is thin at portions hidden inside the indentations formed on the base material but thick at protrusions. In addition thereto, this causes the profile of the dimples formed on the DLC film to not accurately reflect the profile of the indentations and protrusions formed on the base material. This means that experience and intuition is required to form dimples having the desired profile on the DLC film due to needing to form the indentations and protrusions on the base material while considering such changes to the profile and the like.

There are accordingly proposals for methods to form dimples directly on a DLC film without forming indentations on the base material side.

Such methods include a method in which dimples are formed at the same time as a process for forming the DLC film, and a method for forming dimples by post-processing after previously forming the DLC film.

One of these methods is disclosed in Japanese Patent Application Laid-Open (hereafter referred to as JP-A) No. 2004-339564 as a method for forming dimples at the same time the process for the DLC film. This method uses unbalanced magnetron sputtering in which a bias voltage applied to the base material side is adjusted during DLC film forming, so as to enable fine dimples to be formed on the surface of the DLC film obtained thereby (see claims 4 and 5 of JP-A No. 2004-339564).

There is also a method disclosed in JP-A No. 2006-38000 in which, after forming a DLC film, dimples are formed by post-processing using plasma etching, a focused ion beam, or laser processing. There is also a method disclosed in JP-A No. 2005-193390 in which dimples are formed by partially removing a DLC coating using a focused ion beam (see claims 4 and 6 etc. of JP-A No. 2006-38000 and claim 4 of JP-A No. 2005-193390).

Moreover, there is also a separate method disclosed in JP-A No. 2010-126419 described below for forming dimples by post-processing after forming a DLC film. In this method, dimples are formed by ejecting fine particles made from a ceramic material or the like at high velocity onto a surface of a DLC film so as to cause fine-scale detachment thereof, and so as to expose surfaces of a substrate configuring an underlying layer and of an intermediate layer (see paragraph [0016] of JP-A No. 2010-126419) (dimple forming by fine particle impact against a DLC coated member is also mentioned in International Publication WO No. 2017/169303 described below).

Note that although not related to surface treatment of a DLC coated member, the applicant of the present invention has already filed an application related to a method for surface treatment of a metal article with the objective of forming a uniform nano-crystalline structure continuously along the surface of the metal articles that are configured from both soft and hard materials. In this method, substantially spherical ejection particles having a median diameter D50 of from 1 μm to 20 μm and a falling time through air of not less than 10 s/m are ejected against the metal article at an ejection pressure of from 0.05 MPa to 0.5 MPa, so as to form a uniform nano-crystalline structure continuously along a surface of the metal article in a zone to a prescribed depth from the surface of metal article by micronization to nano-crystals having an average crystal grain diameter of not greater than 300 nm and to impart compressive residual stress to the surface of the metal article (see claim 1 etc. of JP-A No. 2017-206761).

From out of the methods described above for forming dimples on a DLC film, forming the dimples during the process for forming the DLC film, as in the method described in JP-A No. 2004-339564, is excellent from the perspective of being able to form dimples without breaking or damaging the formed DLC film.

The method for forming the DLC film is, however, limited to an unbalanced magnetron sputtering method. In an unbalanced magnetron sputtering method, the mechanical properties, such as the smoothness, hardness, etc. of the DLC film to be formed are controlled by changing the bias voltage applied to the substrate. Thus in the method described in JP-A 2004-339564 for forming indentations on a DLC surface by controlling the bias voltage to within a prescribed range (from 150 V to 600 V), the mechanical properties of the DLC film obtained thereby are also limited, and moreover the conditions of operations for adjustment and the like to form indentations of the desired size on the surface of the DLC film are also cumbersome.

In contrast thereto, in methods to form dimples by removing part of a formed DLC film after the DLC film has already been formed, there is no limitation to using an unbalanced magnetron sputtering method, and the dimples can be formed on various DLC films that have been formed by other methods such as ordinary magnetron sputtering (balanced magnetron sputtering), vacuum deposition, plasma CVD etc. without limitation to the method for forming the DLC.

In particular, in the methods for forming dimples by projecting fine particles described in JP-A No. 2010-126419 and International Publication WO 2017/169303, dimples can be formed by using an ejection apparatus with pneumatic ejection or the like (see paragraph [0027] of JP-A No. 2010-126419), namely, by using a blasting apparatus (see paragraph [0076] of International Publication WO 2017/169303). This accordingly enables treatment to be performed at low cost due to being able to form dimples with a simpler apparatus configuration than methods for forming dimples by removing a DLC film by plasma etching, a focused ion beam, by the laser processing of JP-A No. 2006-38000, or by the removal of a DLC film using a focused ion beam of JP-A No. 2005-193390.

However, due to forming dimples in accordance with both these methods being achieved by a configuration in which fine-scale removal or detachment of an already formed DLC film is performed, namely due to the DLC film being damaged to form the dimples, further cracks in or detachment of the DLC film readily arises at the portions on where the dimples are formed.

In consideration thereof, JP-A No. 2010-126419 describes a method for forming dimples by projecting fine particles in which it is stated that the total coverage ratio of dimples should not exceed 10% of the total surface, and also states that detachment of the DLC film readily occurs if dimples are formed in excess of this range (see paragraphs [0016], [0017] of JP-A No. 2005-193390).

This method is accordingly not able to form dimples at a coverage ratio capable of sufficiently exhibiting a function to raise slidability using dimples (i.e. 50% or greater).

It is well known to persons of skill in the art that DLC films are fragile to impact due to having a thin film thickness and high stress, such that DLC films easily break and detach when imparted with a strong impact. Thus in JP-A No. 2010-126419, such properties of a DLC film are utilized to form dimples by causing detachment to occur at portions of the DLC film impacted by fine particles.

Thus in this method, the dimples are formed by processing as described above in which damage referred to as partial detachment is imparted to the DLC film. There is accordingly an inevitable limit to the coverage ratio of dimples formed in this manner.

Methods for forming dimples by projecting fine particles are, however, excellent from the perspective of being able to form dimples comparatively cheaply by using a known blasting apparatus or the like.

Thus an object of the present invention is to provide a method for surface treatment of a DLC coated member that, while being capable of forming dimples comparatively simply by the impact of fine particles, is also capable of forming dimples on a surface of a DLC film without partial detachment of the DLC film nor consequent exposure of the base material occurring, is capable of forming dimples such that a total projected area is not less than 50% of the treated region, and is thus thereby able to impart functionality such as improved slidability.

SUMMARY OF THE INVENTION

In order to achieve the object, a method for surface treatment of a DLC coated member of the present invention comprises:

taking as a treatment subject a DLC coated member having a DLC film coated on a surface of a base material;

ejecting substantially spherical ejection particles having a median diameter D50 of from 1 μm to 20 μm and a falling time through air of not less than 10 s/m against a surface of the DLC film of the DLC coated member at an ejection pressure of from 0.01 MPa to 0.7 MPa; and forming dimples on the surface of the DLC film without exposing the base material so that a total projected area of the dimples is not less than 50% of a treated region and so that the surface of the DLC film is processed to an arithmetic mean height (Sa) of from 0.01 μm to 0.1 μm and a texture aspect ratio (Str) of not less than 0.4.

In the method for surface treatment of a DLC coated member, the ejection velocity of the ejection particles is preferably not less than 80 m/s.

In the method for surface treatment of a DLC coated member, the treatment subject is preferably a DLC coated member with a DLC film formed on the surface of the base material smoothed to a surface roughness Ra of not more than 0.1 μm.

Effect of the Invention

The surface treatment method of the present invention as described above is able to exhibit the following significant advantageous effects.

Namely, hitherto in methods for surface treatment by forming dimples on a DLC film by the impact of fine particles similarly ejected (JP-A No. 2010-126419), the dimples are formed in the DLC film by partially breaking and detaching the DLC film to expose the base material. However, in the surface treatment method of the present invention, the dimples can be formed on the surface of the DLC film without incurring detachment of the DLC film by partial breakage thereof and the accompanying exposure of the base material.

As a result, the method of the present invention enables the DLC film to be prevented from detaching or the like while in use even in cases in which the dimples have been formed on the surface of the treatment target region at a total projected area of not less than 50% of the treated region.

Although the mechanism by which the surface treatment method of the present invention enables dimples to be formed without accompanying damage to and detachment of the DLC film is not entirely clear, the ejection particles employed in the method of the present invention are small, with a median diameter D50 in a range of from 1 μm to 20 μm, and also have a small mass so as to have a falling time through air of not less than 10 s/m. This means that the stress when the surface of the DLC film is impacted is concentrated locally at the impacted portions and is concentrated in the vicinity of the surface, so as not to penetrate to the interface with the base material.

However, the ejection particles defined as described above are readily carried on an airflow, and can be propelled at a velocity close to the velocity of the airflow. This enables the ejection particles to be ejected at a high velocity of around the flow speed of airflow flowing inside ejection nozzle, for example at not less than 80 m/s even when being ejected at a comparatively low ejection pressure of about 0.01 MPa.

In this manner, although detachment of the DLC film can be prevented due to the stress during impact being locally concentrated and not reaching deeper portions (the interface with the base material), a high impact energy is still obtained due to projection being performed at high velocity. This is thought to mean that the density of the DLC film is raised by the energy when the fine particles impact, and also by the reconstruction of structural breaks due to the impact also occurring at the same time, so as to enable the dimples to be formed without causing damage and detachment to the DLC film to occur, and without exposing the base material.

BRIEF DESCRIPTION OF THE DRAWINGS

The objects and advantages of the invention will become apparent from the following detailed description of preferred embodiments thereof provided in connection with the accompanying drawings in which:

FIG. 3A is untreated (Comparative Example 1), and FIG. 3B is subjected to the surface treatment method of the present invention (Example 1).

DETAILED DESCRIPTION OF THE PREFERRED EMBODIMENTS

Figure 1:
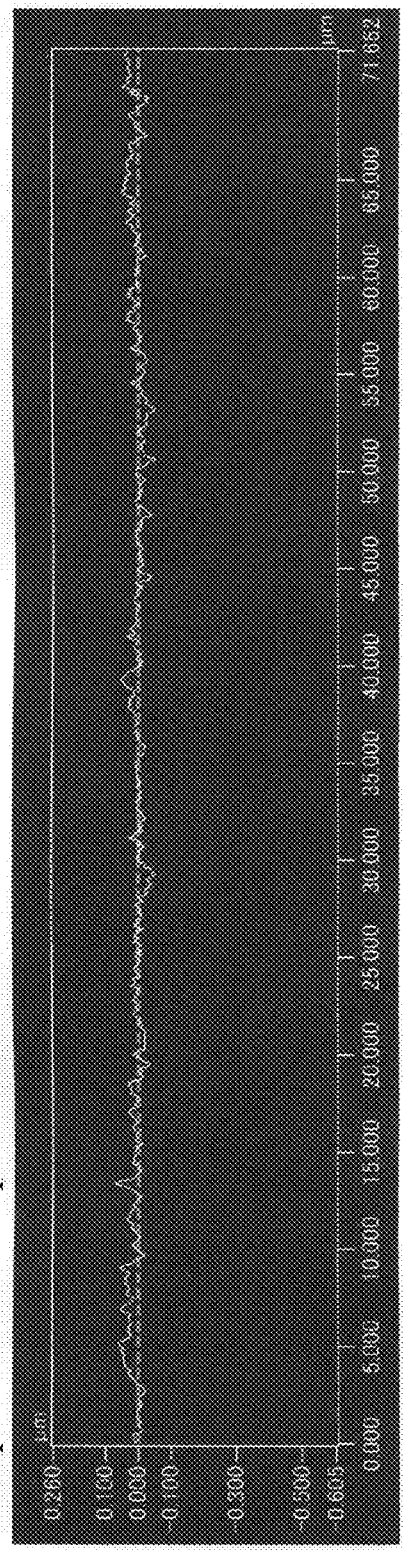
FIG. 1 is a chart of a surface roughness profile of an untreated DLC coated member (Comparative Example 1) as measured by a laser microscope.

Explanation follows regarding an exemplary embodiment of the present invention.

Treatment Subject Article

The subject for treatment by the surface treatment method of the present invention has a surface coated with a DLC film/s, and also has dimples formed on the surface so as to exhibit the advantageous effects of improved slidability and improved demoldability etc. due to oil reservoirs, air reservoirs, release agent reservoirs, etc. The subject for treatment therewith may be any of various DLC coated members that have a DLC film formed thereon and that also find a beneficial effect from forming dimples on the surface of the DLC film, such as, for example, cutting-edges of cutting tools, sliding surfaces of sliding members such as bearings, shafts, etc., molding surfaces of various molds, and the like. The DLC coated member is not limited to being a member entirely coated in a DLC, and may be partially coated with a DLC.

The material of the base material of the DLC coated member that is the subject for treatment is not particularly limited as long as it is a material a DLC film can be formed thereon. Examples of materials to be subject to treatment include various metal base materials such as cemented carbide, cold-worked die steel, high speed tool steel, stainless steel, or the like, as well as ceramic base materials.

Note that in cases in which an under layer is formed on the surface of a treatment subject member, and then of film of DLC is formed on the surface of the under layer, the under layer corresponds to the base material of the present invention.

The DLC coated member serving as the treatment subject is preferably a treatment subject having a DLC film formed on a base material surface polished to a mirror finish having a surface roughness Ra of not more than 0.1 μm. This is because if the surface roughness Ra exceeds 0.1 μm then tips of indentations and protrusions are liable to become the origin of breaks such that detachment readily occurs when treated by the present invention.

There are no particular limitations to the method for forming the DLC film on the DLC coated member that is the treatment subject or to the type of the DLC film formed. The DLC film that is subject to the treatment of the present invention may be a high hardness hydrogen-free DLC film called tetrahedral amorphous carbon (ta-C) which is formed using a vacuum arc deposition method, may be a low hardness hydrogen-free DLC film called amorphous carbon (a-C) which is formed by a sputtering method or the like, may be a hydrogen containing DLC film called hydrogenated amorphous carbon (a-C:H) (with films therein of comparatively high hardness called hydrogenated tetrahedral amorphous carbon (ta-C:H)) which is formed by a plasma CVD method or the like. The subject of treatment by the present invention may also be a DLC film formed with a diamond structure (sp3 bonding), a graphite structure (sp2 bonding), or a mixed structure thereof. A film thickness of the DLC film is 0.5 μm to 2.0 μm.

Surface Treatment

Substantially spherical ejection particles are ejected against a region where dimples are to be formed on a surface of the DLC coated member described above so as to impact this region.

Examples of the ejection particles, ejection apparatus, and ejection conditions employed when performing the above surface treatment are given below.

(1) Ejection Particles

For the substantially spherical ejection particles employed in the surface treatment method of the present invention, "substantially spherical" means that they do not need to be strictly "spherical", and ordinary "shot" may be employed therefor. Particles of any non-angular shape, such as an elliptical shape and a barrel shape, are included in "substantially spherical ejection particles" employed in the present invention.

Materials that may be employed for the ejection particles include both metal-based and ceramic-based materials. Examples of materials for metal-based ejection particles include steel, high-speed tool steels (HSS) (SKH), stainless steels (SUS), chromium boron steels (FeCrB), and the like. Examples of materials that may be employed for the ceramic-based ejection particles include alumina ($Al_2O_3$), zirconia ($ZrO_2$), zircon ($ZrSiO_4$), silicon carbide (SiC), glass, and the like.

Regarding the particle diameter of the ejection particles employed, particles having a median diameter (D50) in a range of from 1 μm to 20 μm are employed.

"Median diameter D50" refers to the diameter at a cumulative mass 50 percentile, namely, to a diameter that when employed as a particle diameter to divide a group of particles into two, results in the total mass of particles in the group of particles of larger diameter being the same as the total mass of particles in the group of particles of smaller diameter. This is the same definition as "particle diameter at a cumulative 50% point" in JIS R 6001 (1987).

For fine powder ejection particles having a median diameter from 1 μm to 20 μm, the ejection particles can be imparted with the property of having a long falling time through air (caused to float in air) by selecting a material density of the ejection particles. Ejection particles having such properties readily ride on an airflow, and can be propelled with a velocity similar to the flow speed of the airflow.

In the surface treatment method of the present invention, the ejection particles employed have a falling time in still air conditions of not less than 10 s/m. This enables the ejection particles to be ejected at substantially the same velocity as the flow speed of an airflow being ejected from an ejection nozzle of a blasting apparatus.

With regard to the falling speed, for the same particle diameter, the falling time is longer, the lower the density of the material configuring the ejection particles. For iron-based ejection particles having a relative density of 7.85, the falling time is 10.6 s/m for a particle diameter of 20 μm, and 41.7 s/m for a particle diameter of 10 μm. For ceramic-based ejection particles having a relative density of 3.2, the falling time is 26.3 s/m for a particle diameter of 20 μm, and 100 s/m for a particle diameter of 10 μm.

(2) Ejection Apparatus

A known blasting apparatus for ejecting abrasive together with a compressed gas may be employed as the ejection apparatus to eject the ejection particles described above toward the surface of the region to be treated.

Such blasting apparatuses are commercially available, such as a suction type blasting apparatus that ejects abrasive using a negative pressure generated by ejecting compressed gas, a gravity type blasting apparatus that causes abrasive falling from an abrasive tank to be carried by compressed gas and ejected, a direct pressure type blasting apparatus in which compressed gas is introduced into a tank filled with abrasive and the abrasive is ejected by merging the abrasive flow from the abrasive tank with a compressed gas flow from a separately provided compressed gas supply source, and a blower type blasting apparatus that carries and ejects the compressed gas flow from such a direct pressure type blasting apparatus with a gas flow generated by a blower unit. Any one of the above may be employed to eject the ejection particles described above.

(3) Treatment Conditions

Substantially spherical ejection particles configured from one of the materials described above or the like and having a median diameter D50 of from 1 μm to 20 μm and a falling time through air of not less than 10 s/m are ejected against the DLC coated member as described above at an ejection pressure of from 0.01 MPa to 0.7 MPa so as to form dimples without exposing the base material.

The ejection of such ejection particles is performed against the surface of the DLC film until the total projected area of the dimples is not less than 50% of the treated region. Note that in the present specification the "projected area" means the area of the outlines of the dimples.

Moreover, the ejection particles are ejected so that the surface roughness of the DLC surface after treatment is an arithmetic mean height Sa as defined by ISO 25178 lying within a range of from 0.01 μm to 0.1 μm.

Moreover, this is performed so as to achieve a texture aspect ratio Str as defined by ISO 25178 of not less than 0.4, so as to work the surface of the DLC film to a non-directional surface.

Operation Etc

The surface treatment method of the present invention as described above enables fine dimples to be formed on the DLC film at a total projected area of not less than 50% of the treated region without causing the DLC film to detach, and accordingly without exposing the base material.

As a result, treating with the method of the present invention enables resistance during sliding to be reduced. This is achieved by reducing the area of contact between the DLC coated member having fine dimples formed on the surface of the DLC film and the opposing member.

Moreover, the indentation-protrusion profile of the surface of the DLC coated member formed by the method of the present invention is a profile predominated by smooth indentations and protrusions. This means that the angles of slope of the indentations and protrusions are shallow, and a reduction is also achieved in the frictional force acting on the protrusions.

Moreover, due to shallow dimples of small diameter being formed, an improvement in slidability is achieved due to obtaining an air lubrication effect by a layer of air being formed over the surface of the DLC film during sliding.

Furthermore, the dimples formed also function as oil reservoirs, and so an improvement in slidability can also be achieved in both cases in which lubricating oil is applied to sliding portions, and also in cases in which none is applied.

EXAMPLES

Next, the results will be given of comparative tests performed on the DLC coated members to which the surface treatment by the method of the present invention has been performed, and on untreated DLC coated members.

A profile analyzing laser microscope (VK-X250, manufactured by Keyence Corporation) was employed to measure roughness as described below with measurements taken at a measurement magnification of 3000×. The analysis software applicable to this laser microscope (Multi-File Analysis Application VK-H1MX) was employed to compute the profile obtained thereby based on these analysis results.

Test Example 1: Aluminum-can-Forming Draw Die (1) Test Method

An aluminum-can-forming draw die on which the surface treatment by the method of the present invention has been performed, and an untreated aluminum-can-forming draw die were each employed to form 10,000 aluminum cans. After forming the cans therewith, the state of DLC film detachment from the surface of the aluminum-can-forming draw die and the state of aluminum adhesion thereto were then respectively evaluated by visual inspection.

(2) Examples and Comparative Example

A cemented carbide aluminum-can-forming draw die was prepared by forming a DLC film with a film thickness of 0.5 μm on the surface of a base material after lap polishing the surface to an Ra of not more than 0.02 μm. The die surface was then subjected to the surface treatment method of the present invention under the conditions listed in Table 1 (Examples 1 to 3). These dies and an untreated cemented carbide aluminum can-forming draw die (Comparative Example 1) were then respectively employed to form aluminum cans.

TABLE 1

Examples 1 to 3 and Comparative Example 1

|  | Example 1 | Example 2 | Example 3 | Comparative Example 1 |
|---|---|---|---|---|
| Ejection apparatus | LDQ-3 manufactured by Fuji Manufacturing Co., Ltd | SFK-2 manufactured by Fuji Manufacturing Co., Ltd | FDQ-3 manufactured by Fuji Manufacturing Co., Ltd | Untreated |
| Ejection Type | Blower type | Suction type | Direct pressure type |  |
| Ejection particle median diameter (μm) | Zirconia 16 | Alumina 10 | Steel alloy 4 |  |
| Ejection pressure (MPa) | 0.03 | 0.1 | 0.3 |  |
| Ejection velocity (m/s) | 80 m/s or more | 80 m/s or more | 80 m/s or more |  |
| Arithmetic mean height (Sa) | 0.03 μm | 0.04 μm | 0.06 μm | 0.01 μm |
| Depth of dimple (μm) | 0.2 μm or less | 0.2 μm | 0.4 μm | 0 μm |
| Texture aspect ratio (Str) | 0.44 | 0.51 | 0.54 | 0.16 |

(3) Evaluation Results

The laser microscope (VK-X250, manufactured by Keyence Corporation) mentioned above was employed for measurement, and the respective surface roughness profiles of the dies are illustrated in FIG. 1 (untreated: Comparative Example 1) and in FIG. 2 (surface treatment of the present invention: Example 1).

Figure 3A:
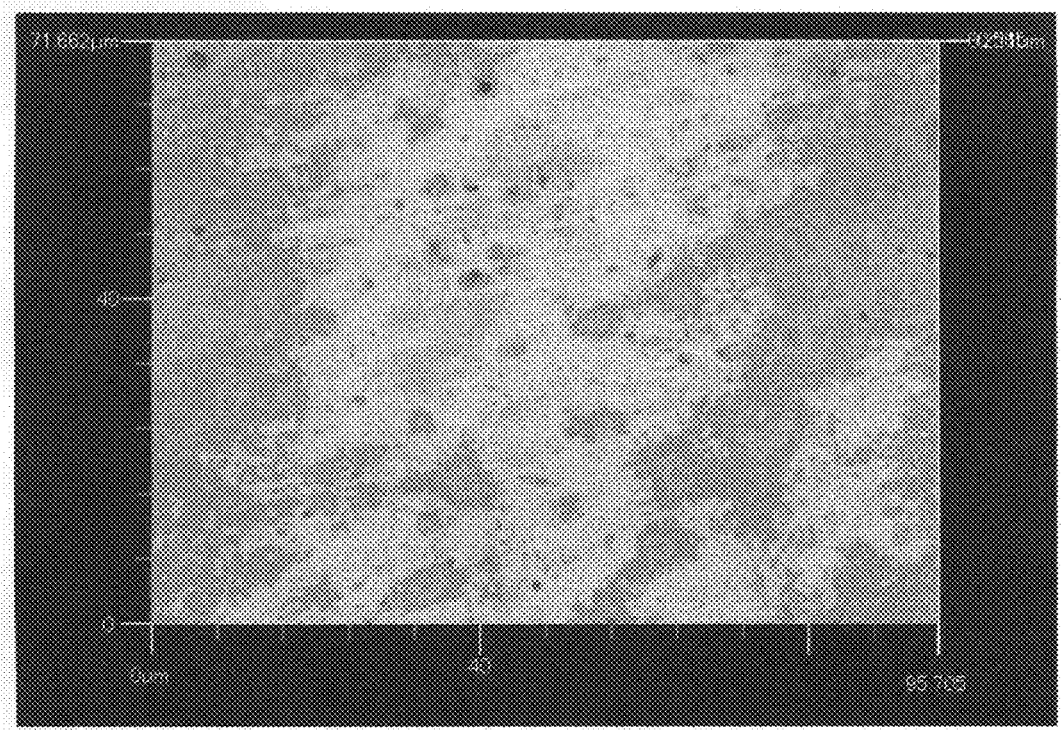
FIG. 3A and FIG. 3B are electron micrographs of a mold surface.
Figure 3B:
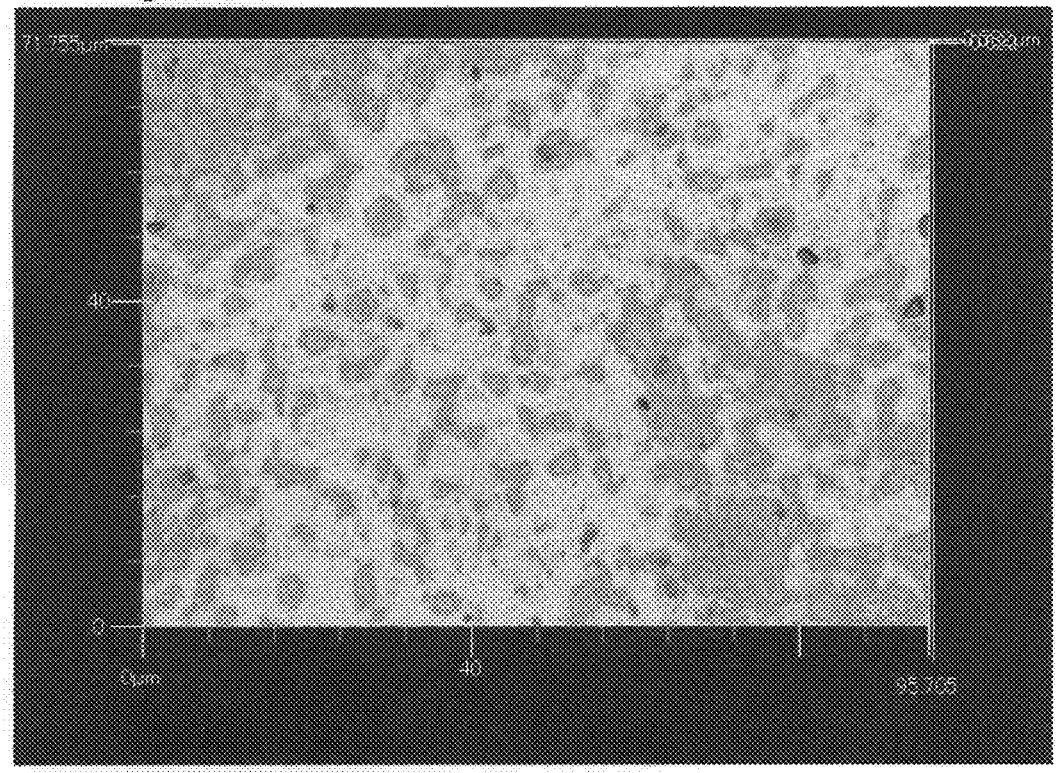

Electron micrographs imaging the surfaces of the respective dies are illustrated in FIG. 3A for untreated (Comparative Example 1) and in FIG. 3B for surface treatment of the present invention (Example 1).

Furthermore, the results listed in the following Table 2 were confirmed by visual inspection for the state of DLC film detachment and the state of aluminum adhesion after forming aluminum cans for the aluminum-can-forming draw dies of Examples 1 to 3 and for the aluminum-can-forming draw die of Comparative Example 1.

TABLE 2

Confirmed Results of the State of DLC Film Detachment and Aluminum Adhesion

|  | Example 1 | Example 2 | Example 3 | Comparative Example 1 |
|---|---|---|---|---|
| Detachment of DLC film | None | None | None | Partial detachment |
| Aluminum adhesion | Very slight | Very slight | Slight | Significant |

Figure 2:
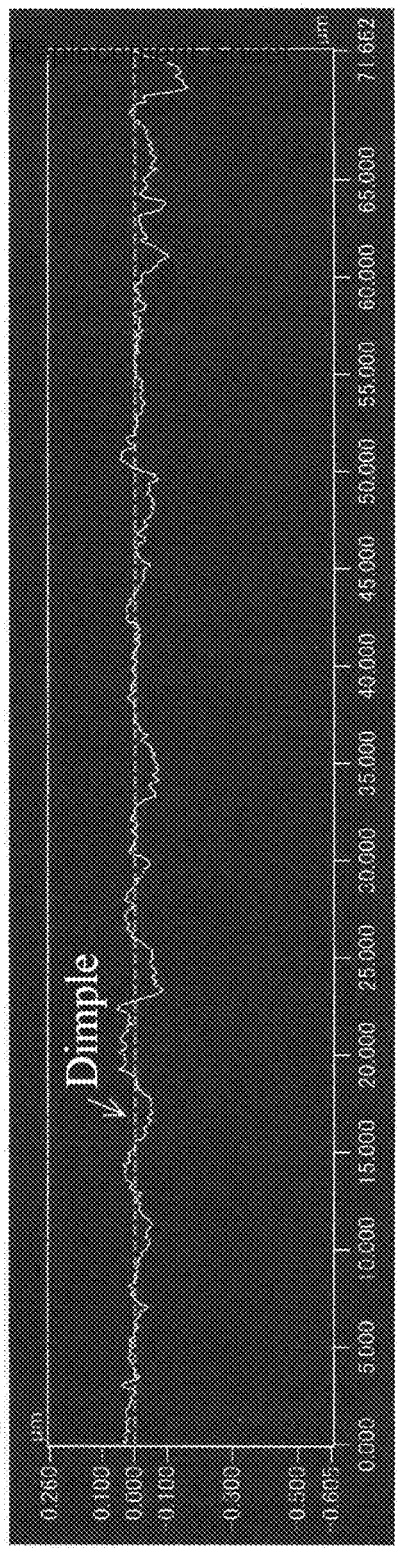
FIG. 2 is a chart of a surface roughness profile of a DLC coated member subjected to the surface treatment method of the present invention (Example 1) as measured by a laser microscope.

As is clear from a comparison with the surface of the untreated die (Comparative Example 1) illustrated in FIG. 1, confirmation of dimple formation on the surface could be made for the die subjected to the surface treatment of the present invention illustrated in FIG. 2.

These dimples were formed to DLC with a film thickness 0.5 μm, and were all formed with a depth of not more than 0.2 μm. Thus the surface treatment method of the present invention was able to form dimples on the surface of the DLC coated member without exposing the base material of the die. This enabled the DLC film to be prevented from detaching with dimple formation positions acting as the origin thereof, as is the case when local detachment of the DLC film has been induced.

Moreover, as is apparent from FIG. 2 and FIG. 3B, the surface profile of the dies formed with the dimples using the surface treatment method of the present invention was predominated by indentations and protrusions having comparatively smooth profiles, thereby achieving a reduction in the frictional force acting on the protrusions during sliding.

As a result, although partial detachment of the DLC film together with comparatively large aluminum adhesion occurred after forming aluminum cans with the aluminum-can-forming draw die not subjected to the surface treatment by the method of the present invention (Comparative Example 1), there was no detachment of the DLC film seen and there was only very slight or slight aluminum adhesion for the aluminum-can-forming draw die subjected to the surface treatment method of the present invention (Examples 1 to 3). Thus performing surface treatment with the surface treatment by the method of the present invention was confirmed to improve the mechanical properties in comparison to the untreated DLC coated member.

Test Example 2: Profile Punch (1) Test Method

A profile punch subjected to surface treatment by the method of the present invention and an untreated profile punch were respectively employed to die-cut electrical component material (brass material) 15,000 times. The state of DLC film detachment from the surface of the profile punches after use was then evaluated by visual inspection.

(2) Examples and Comparative Example

A cemented carbide profile punch was prepared by forming a DLC film with a film thickness of 1.5 μm on the surface of a base material after lap polishing the surface to an Ra of not more than 0.02 μm. The cemented carbide profile punch was then subjected to the surface treatment method of the present invention under the conditions listed in Table 3 (Examples 4 to 6). These profile punches and an untreated cemented carbide profile punch (Comparative Example 2) were then respectively employed for punching.

TABLE 3

Examples 4 to 6 and Comparative Example 2

|  | Example 4 | Example 5 | Example 6 | Comparative Example 2 |
|---|---|---|---|---|
| Ejection apparatus | SFK-2 manufactured by Fuji Manufacturing Co., Ltd | LDQ-3 manufactured by Fuji Manufacturing Co., Ltd | FDQ-3 manufactured by Fuji Manufacturing Co., Ltd | Untreated |
| Ejection Type | Suction type | Blower type | Direct pressure type |  |
| Ejection particle median diameter (μm) | Zirconia 15 | Zircon 5 | Glass 3 |  |
| Ejection pressure (MPa) | 0.1 | 0.06 | 0.04 |  |
| Ejection velocity (m/s) | 80 m/s or more | 80 m/s or more | 80 m/s or more |  |
| Arithmetic mean height (Sa) | 0.04 μm | 0.02 μm | 0.56 μm | 0.01 μm |
| Depth of dimple (μm) | 0.2 μm or less | 0.15 μm or less | 0.5 μm or less | 0 μm |
| Texture aspect ratio (Str) | 0.61 | 0.45 | 0.54 | 0.14 |

(3) Evaluation Results

The results seen for the state of DLC film detachment for the profile punches of Examples 4 to 6 and for the profile punch of Comparative Example 2 are listed in the following Table 4.

TABLE 4

State of DLC Film Detachment

|  | Example 4 | Example 5 | Example 6 | Comparative Example 2 |
|---|---|---|---|---|
| DLC Film Detachment | None | None | None | Detachment at leading end of punch |

The above results confirmed that the DLC film at the leading end of the punch became detached after cutting out electrical component material with a profile punch not subjected to the surface treatment method of the present invention (Comparative Example 2).

In contrast thereto, no DLC film detachment could be seen at any portion of the profile punches subjected to surface treatment by the method of the present invention (Examples 4 to 6), including at the leading end portions of the punches. This confirmed that performing surface treatment by the surface treatment method of the present invention improved the mechanical properties of the punches in comparison to the untreated DLC coated member.

Test Example 3: Component Transport Rail (1) Test Method

A component transport rail subjected to surface treatment by the method of the present invention (Example 7) and an untreated component transport rail (Comparative Example 3) were respectively employed to transport components. The presence or absence of catching of the transported components during transportation was then confirmed by visual inspection.

(2) Examples and Comparative Example

A component transport rail made from SUS304 was prepared by forming a DLC film with a film thickness of 1.5 μm on the surface of a base material after lap polishing the surface to an Ra of not more than 0.02 μm. The component transport rail was then subjected to the surface treatment method of the present invention under the conditions listed in Table 5 (Example 7). This component transport rail and an untreated component transport rail (Comparative Example 3) were then respectively employed for component transport.

TABLE 5

Example 7 and Comparative Example 3

|  | Example 7 | Comparative Example 3 |
|---|---|---|
| Ejection apparatus | SFK-2 manufactured by Fuji Manufacturing Co., Ltd | Untreated |
| Ejection Type | Suction type |  |
| Ejection particle median diameter (μm) | Steel alloy 15 |  |
| Ejection pressure (MPa) | 0.2 |  |
| Ejection velocity (m/s) | 80 m/s or more |  |
| Arithmetic mean height (Sa) | 0.03 μm | 0.01 μm |
| Depth of dimple (μm) | 0.2 μm or less | 0 μm |
| Texture aspect ratio (Str) | 0.48 | 0.14 |

(3) Evaluation Results

The results of the state of catching of transported components for the component transport rail of Example 7 and for the component transport rail of Comparative Example 3 confirmed by visual inspection are listed in Table 6 below.

TABLE 6

Catching of Transported Components

|  | Example 7 | Comparative Example 3 |
|---|---|---|
| Catching of transported components | None | Some |

The above results confirmed that catching of transported components occurred with the component transport rail (Comparative Example 3) not subjected to the surface treatment method of the present invention. Catching at these portions is thought to be due to cracks and detachment developing in the DLC film.

In contrast thereto, for the component transport rail (Example 7) subjected to surface treatment by the method of the present invention, no catching of transported components could be seen, and confirmation was made that cracks and detachment did not develop in the DLC film, and good slidability was exhibited thereby.

Thus the broadest claims that follow are not directed to a machine that is configured in a specific way. Instead, said broadest claims are intended to protect the heart or essence of this breakthrough invention. This invention is clearly new and useful. Moreover, it was not obvious to those of ordinary skill in the art at the time it was made, in view of the prior art when considered as a whole.

Moreover, in view of the revolutionary nature of this invention, it is clearly a pioneering invention. As such, the claims that follow are entitled to very broad interpretation so as to protect the heart of this invention, as a matter of law.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described;

The invention claimed is:

1. A method for surface treatment of a DLC coated member, the method comprising:
   taking as a treatment subject a DLC coated member having a DLC film coated on a surface of a base material;
   ejecting substantially spherical metal-based or ceramic-based ejection particles of which a particle diameter and a density are set to have a median diameter D50 of within a range from 1 μm to 20 μm and a falling time in still air condition of not less than 10 s/m against a surface of the DLC film of the DLC coated member at an ejection pressure of from 0.01 MPa to 0.7 MPa; and
   forming dimples on the surface of the DLC film without exposing the base material so that a total projected area of the dimples is not less than 50% of a treated region and so that the surface of the DLC film is processed to an arithmetic mean height (Sa) of from 0.01 μm to 0.1 μm and a texture aspect ratio (Str) of not less than 0.4.

2. The method of claim 1, wherein ejection velocity of the ejection particles is not less than 80 m/s.

3. The method of claim 1, wherein the treatment subject is a DLC coated member with a DLC film formed on the surface of the base material smoothed to a surface roughness Ra of not more than 0.1 μm.

4. The method of claim 2, wherein the treatment subject is a DLC coated member with a DLC film formed on the surface of the base material smoothed to a surface roughness Ra of not more than 0.1 μm.

* * * * *